United States Patent [19]
McMillan et al.

[11] Patent Number: 5,759,923
[45] Date of Patent: Jun. 2, 1998

[54] METHOD AND APPARATUS FOR FABRICATING SILICON DIOXIDE AND SILICON GLASS LAYERS IN INTEGRATED CIRCUITS

[75] Inventors: Larry D. McMillan; Michael C. Scott; Carlos A. Paz de Araujo, all of Colorado Springs, Colo.; Tatsuo Otsuki, Osaka, Japan; Shinichiro Hayashi, Colorado Springs, Colo.

[73] Assignees: Symetrix Corporation, Colorado Springs, Colo.; Matsushita Electronics Corporation, Japan

[21] Appl. No.: 615,806

[22] Filed: Mar. 14, 1996

Related U.S. Application Data

[63] Continuation-in-part of Ser. No. 477,111, Jun. 7, 1995, which is a continuation-in-part of Ser. No. 993,380, Dec. 18, 1992, Pat. No. 5,456,945, which is a continuation-in-part of Ser. No. 660,428, Feb. 25, 1991, abandoned.

[51] Int. Cl.$^6$ ................................... H01L 21/00
[52] U.S. Cl. ................... 438/788; 438/778; 438/787
[58] Field of Search ..................... 438/778, 787, 438/788; 427/252, 421

[56] References Cited

U.S. PATENT DOCUMENTS 5,456,945  10/1995  McMillan et al. ............... 427/252

FOREIGN PATENT DOCUMENTS

WO 94/10084  5/1994  WIPO ................... C01B 13/32
WO 94/10084  10/1995  WIPO.

OTHER PUBLICATIONS

Marage et al., "A new route for the deposition of SiO2 sol-gel coatings." Thin Solid Films vol. 238 No. 2, pp. 218-227 Feb. 1994.

Thin Solid Films, vol. 238, No. 2, 1 Feb. 1994, Marage P. et al., "A New Route for the Deposition of SiO$_2$ Sol-gel Coatings".

P. Marage et al.; A New Route for the Deposition of SiO$_2$ Sol-Gel Coatings; Thin Solid Films, 238; Feb. 1, 1984, No. 2; pp. 218-227.

*Primary Examiner*—Charles L. Bowers, Jr.
*Assistant Examiner*—Keith Christianson
*Attorney, Agent, or Firm*—Duft, Graziano & Forest, P.C.

[57] ABSTRACT

A precursor liquid comprising silicon in a xylenes solvent is prepared, a substrate is placed within a vacuum deposition chamber, the precursor liquid is misted, and the mist is flowed into the deposition chamber while maintaining the chamber at ambient temperature to deposit a layer of the precursor liquid on the substrate. The liquid is dried, baked, and annealed to form a thin film of silicon dioxide or silicon glass on the substrate. Then an integrated circuit is completed to include at least a portion of the silicon dioxide or silicon glass layer as an insulator for an electronic device in the integrated circuit.

18 Claims, 8 Drawing Sheets

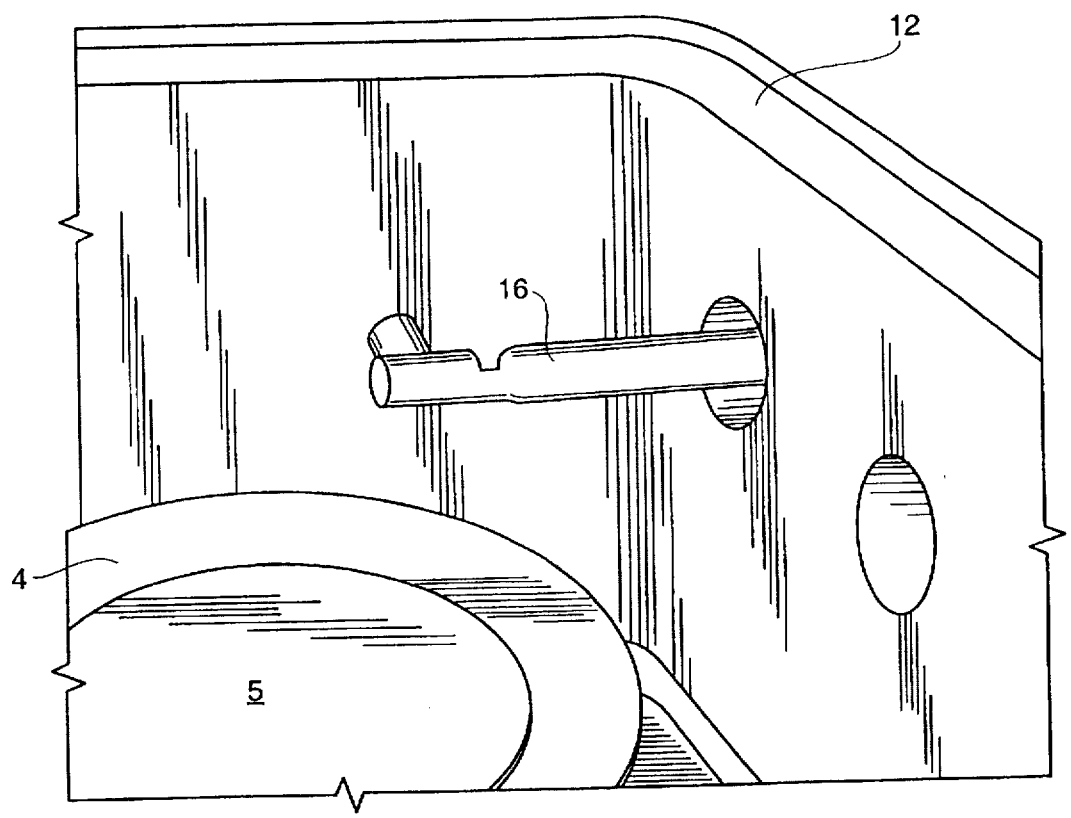
FIG. 10
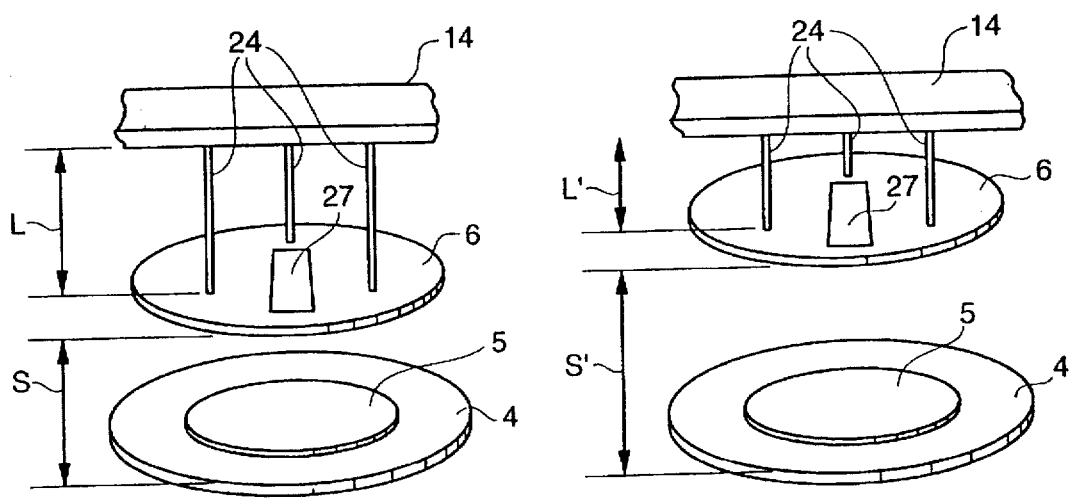
FIG. 11                FIG. 12

METHOD AND APPARATUS FOR FABRICATING SILICON DIOXIDE AND SILICON GLASS LAYERS IN INTEGRATED CIRCUITS

This application is a continuation-in-part of U.S. patent application Ser. No. 08/477,111, filed Jun. 7, 1995 which is a continuation-in-part of U.S. patent application Ser. No. 07/993,380, filed Dec. 18, 1992, now U.S. Pat. No. 5,456,945, which is a continuation-in-part of U.S. patent application Ser. No. 07/660,428 filed Feb. 25, 1991, now abandoned.

BACKGROUND OF THE INVENTION

1. Field of the Invention

The invention relates to methods for depositing high quality films of silicon dioxide and silicon glass on substrates, and apparatus for effecting such methods. Particularly, the invention relates to the fabrication of thin films of silicon dioxide and silicon glass of suitable thinness and quality for use in integrated circuits.

2. Statement of the Problem

It is well-known that silicon dioxide and silicon glass layers form an important part of integrated circuits. These may be formed in many ways, such as by oxidation of silicon. Some varieties of silicon oxide or silicon glass are known by the method of formation such as APCVD NSG (atmospheric pressure chemical vapor deposited non-doped silicon glass) or SOG (spin-on glass) layer. Others are known by the particular dopants used, such as BPSG (borophosphosilicate glass). Generally silicon oxides and silicon glasses are formed by methods substantially different than the methods by which other layers of the integrated circuit are made. This results in many handling steps between the processes, and requires a relatively high cost of setting up the manufacturing of an integrated circuit. There is a long-felt need for a silicon dioxide and silicon glass fabrication process that corresponds more closely with the manufacturing processes used for producing other layers in the circuit. If this were a simple process, it would also make the overall manufacturing process for an integrated circuit less expensive.

SUMMARY OF THE INVENTION

The present invention has been developed to overcome the many problems and disadvantages associated with known deposition techniques for fabricating thin films of silicon dioxide and silicon glass for use in integrated circuits, and to generally fulfill a great need in the art by providing a production worthy process which can be used for easily and economically producing thin films (from a few angstroms to microns in thickness) of silicon dioxide and silicon glass. This method also uses nearly the same apparatus as recent methods developed for forming complex metal oxides, such as layered superlattice materials, which are used in integrated circuits.

According to the present invention, there is provided a method of fabricating a silicon dioxide or silicon glass thin film comprising the steps of: providing a precursor liquid including silicon in an effective amount for forming silicon dioxide or silicon glass upon treatment by heating or other methods; providing a substrate within an enclosed deposition chamber, producing a mist of the precursor liquid, and introducing the mist into the deposition chamber so that the mist is flowed evenly over the substrate to form a film of the precursor liquid on the substrate. Preferably the deposition is performed with the substrate at ambient temperature, which is preferably between about 15° C. and 40° C. In general, ambient temperature may be between about −50° C. and 100° C.

In one embodiment, deposition occurs while applying ultraviolet radiation to the mist and the substrate.

In another embodiment, deposition occurs while applying a DC bias between two parallel plates with the substrate located between them.

During the deposition process the deposition chamber is pumped to a slight vacuum to remove the solvent from the film of precursor liquid; after deposition the vacuum is preferably increased to dry the precursor, thus leaving a layer of solid silicon containing material on the substrate. The substrate is then preferably heated and annealed to produce a solid thin film of silicon dioxide or silicon. Preferably, an integrated circuit is then completed on the substrate.

Since the process is performed at essentially ambient temperature and at very nearly ambient pressure, it is a relatively easy process to perform in a manufacturing plant. Further, the mist formation does not use any complex apparatus.

The mist being flowed into the deposition chamber is contained within a small, semi-enclosed space within the deposition area by an adjustable barrier plate located above the substrate. The direction of mist flow is parallel to the substrate, which allows molecular collisions at substantially ambient temperature to effect the coating of a substrate, as opposed to the relatively violent alternatives of using the momentum of the particles or heating the liquid material to force or accelerate the deposition process. Heating of the material to be deposited, either prior to or during deposition, results in a film which is more likely to crack or form pin holes during the drying stage.

Also, since the mist is "flowed on," the deposition of the applied material is extremely conformal over the top of any "steps" on a given substrate, and tends to smoothly conform to the hard angle at the bottom of the step.

According to the present invention there is also provided apparatus for effecting the above methods.

It is an object of the present invention to provide highly versatile methods and apparatus having the capability to easily and inexpensively produce silicon dioxide and silicon glass thin films of integrated circuit quality.

It is a further object of the present invention to provide such methods and apparatus having the capability of producing such thin films of silicon dioxide and silicon glass in a wide range of thicknesses, i.e., from a few angstroms to microns in thickness.

It is a still further object of the present invention to produce thin films of silicon dioxide or silicon glass at substantially ambient temperature and at slightly below atmospheric pressure.

Other objects, advantages and salient features of the present invention will become apparent from the following detailed description which, when taken into conjunction with the annexed drawings, discloses a number of embodiments of the present invention.

BRIEF DESCRIPTION OF THE DRAWING

FIG. 10 is a perspective view showing the placement of the ultraviolet radiation source within the deposition chamber;

FIGS. 11 and 12 illustrate several of the possible positions of the adjustable barrier plate;

DETAILED DESCRIPTION OF THE PREFERRED EMBODIMENT

1. Overview

Figures 1A, 1B:
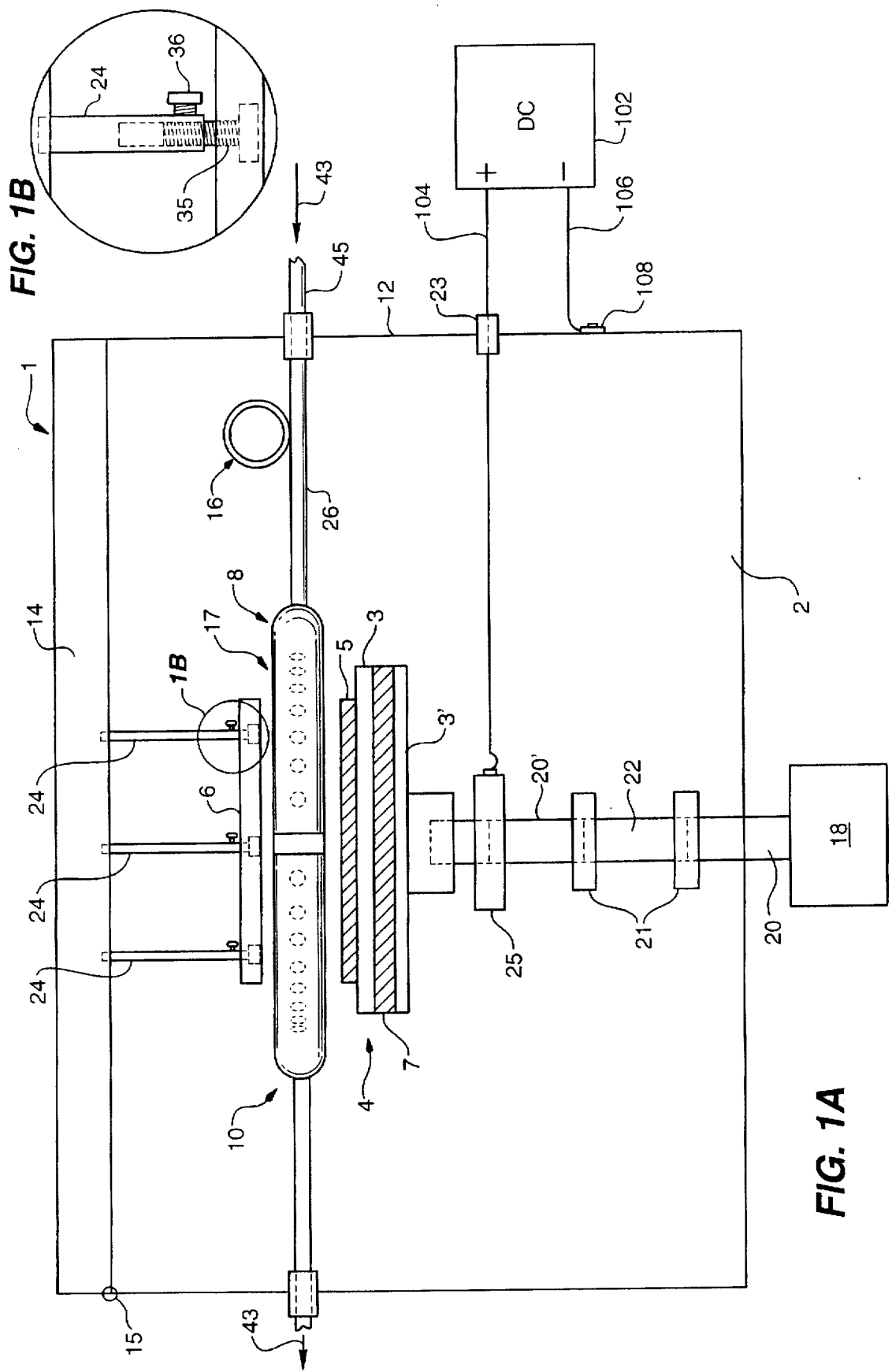
FIG. 1 is a cutaway side view of the deposition chamber of the apparatus according to one embodiment of the invention.

According to a primary aspect of the present invention, precursor liquids containing silicon bonded with oxygen are initially prepared, and then mists of the solutions are generated, flowed into a deposition chamber and deposited in thin films/layers on substrates disposed within the deposition chamber. As is conventional in the art, in this disclosure, the term "substrate" is used in a general sense where it includes one or number of layers 5 (FIG. 14) of material on which the silicon precursor may be deposited, and also in a particular sense in which it refers to the wafer 1222 itself. Unless otherwise indicated it means any object on which a layer of silicon or silicon glass is deposited using the process and apparatus of the invention. Precursor liquids include sol-gel precursor formulations, which in general are comprised of silicon-alkoxides in an alcohol solvent, and metalorganic precursor formulations, sometimes referred to as MOD formulations, which in general comprise a silicon-carboxylate formed by reacting a carboxylic acid, such as neodecanoic acid or 2-ethylhexanoic acid, with a metal or metal compound in a solvent, as well as other precursor formulations. Silicon 2-ethylhexanoates and neodecanates appear to be the most useful of these compounds. Thin films formed utilizing medium chain length carboxylates like these in the precursors do not crack, blister or peel on baking as do the thin films formed utilizing longer-chain carboxylates.

The term "mist" as used herein is defined as fine drops of a liquid carried by a gas. The term "mist" includes an aerosol, which is generally defined as a colloidal suspension of solid or liquid particles in a gas. The term mist also includes a vapor, a fog, as well as other nebulized suspensions of the precursor solution in a gas. Since the above terms have arisen from popular usage, the definitions are not precise, overlap, and may be used differently by different authors. Herein, the term aerosol is intended to include all the suspensions included in the text *Aerosol Science and Technology*, by Parker C. Reist, McGraw-Hill, Inc., New York, 1983, which is hereby incorporated by reference. The term "mist" as used herein is intended to be broader than the term aerosol, and includes suspensions that may not be included under the term aerosol, vapor, or fog.

The precursor liquid solution is preferably obtained by preparing precursors for each element using alkoxide chemistry, carboxylic acid chemistry, or other wet chemistry techniques, which lead to a common solvent. The solution having that common solvent is preferably used as the sole source for the entire deposition process. However, the invention also contemplates using multiple precursor sources in parallel. In particular, other sources may be used in parallel for doping or modifying the final desired compound. In the preferred precursor liquid, the silicon dioxide and the dopants, such as phosphorus and boron, contained in one or more precursor chemical compounds in solution with the common solvent. An example of a precursor formation is illustrated below.

Preferably the solvent's boiling point should be within the range 110° C.–170° C. The preferred solvents are the xylenes, n-butyl acetate, n-octane, and 2-methoxyethanol, though any of the solvents in Table A may be used. The term "xylenes" is used herein since xylene usually is available in a form which contains three fractionations of xylene; the term xylenes is intended to include any solvent containing any one or several of the fractionations.

TABLE A

| Solvent | Boiling Point |
| --- | --- |
| n-Butyl acetate | (bp = 126.5° C.) |
| N,N-dimethylformamide | (bp = 153° C.) |
| 2-Methoxyethyl acetate | (bp = 145° C.) |
| Methyl isobutyl ketone | (bp = 116° C.) |
| Methyl isoamyl ketone | (bp = 144° C.) |
| Isoamyl alcohol | (bp = 132° C.) |
| Cyclohexanone | (bp = 156° C.) |
| 2-Ethoxyethanol | (bp = 135° C.) |
| 2-Methoxyethyl ether | (bp = 162° C.) |
| Methyl butyl ketone | (bp = 127° C.) |
| Hexyl alcohol | (bp = 157° C.) |
| 2-Pentanol | (bp = 119° C.) |
| Ethyl butyrate | (bp = 121° C.) |
| Nitroethane | (bp = 114° C.) |
| Pyrimidine | (bp = 123° C.) |
| 1,3,5 Trioxane | (bp = 115° C.) |
| Isobutyl isobutyrate | (bp = 147° C.) |
| Isobutyl propionate | (bp = 137° C.) |
| Propyl propionate | (bp = 122° C.) |
| Ethyl Lactate | (bp = 154° C.) |
| n-Butanol | (bp = 117° C.) |
| n-Pentanol | (bp = 138° C.) |
| 3-Pentanol | (bp = 116° C.) |

Use of precursor liquids is highly desirable for many reasons. First, the solutions themselves are relatively easy to generate. The precursor liquids used in the present invention are substantially easier to handle precisely then the corresponding materials used in conventional silicon glass deposition methods mentioned above and substantially faster than the methods of fabricating silicon dioxide mentioned above. Moreover, the precursor liquids allow the silicon and silicon glass to be fabricated by a method highly compatible with new methods of forming complex compounds that are often interlayered with the silicon and silicon glass compounds.

The precursor liquids used in the present invention are also stabilized solutions. Here, "stabilized" means that key silicon-oxygen bonds of the silicon dioxide or silicon glass are formed in the process of forming the precursor, and after such formation are stable. This has two aspects. First, the solutions do not react or deteriorate when stored over moderately long periods. Thus, the stabilized solutions according to the invention have relatively long shelf lives, which makes the manufacturing process simpler and more efficient. The second aspect of the solutions being stabilized is that bonds formed when forming the precursor remain stable throughout the deposition process and form at least a portion of the bonds in the final silicon compound. For example, a silicon-alkoxide may be given by the formula: R—O—S—O—R, where S is the silicon, O is oxygen, and R is an alkyl group.

When controlled energy is added to the silicon alkoxide, the result is a molecule comprising a silicon atom bound to an oxygen atom plus alkyl molecules or fragments of alkyl molecules as represented by the equation:

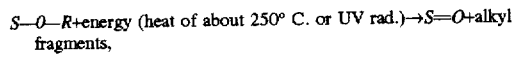

S—O—R+energy (heat of about 250° C. or UV rad.)→S=O+alkyl fragments, where "=" represents a double bond. In terms of a silicon carboxylate, the equation may be written:

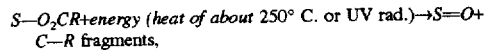

S—O₂CR+energy (heat of about 250° C. or UV rad.)→S=O+ C—R fragments, where R is again the alkyl group, S the silicon, O is oxygen, and C is carbon. In the preferred embodiment, the precursor is deposited on the substrate and the disassociation of the silicon-oxide molecules from the solvent and the alkyl or other fragments takes place on the substrate, although some of the disassociation may take place in the mist. The removal of the undesired fragments primarily takes place by being pumped out with a vacuum and/or being driven off by heating at a low heat of less than about 250° C. Generally after the bake (heating) step all disassociation is complete. The anneal process repairs oxygen deficiencies in the film and forces the desired crystal structure, however the basic silicon-oxide bonds remain. Thus the silicon-oxygen bond in the precursor remains stable and passes through the deposition process to form the silicon-oxygen bond of the final desired silicon dioxide or silicon glass compound.

The use of precursor liquids results in high quality of thin films because the precursor liquid can be accurately and consistently produced such that the desired chemical compound after deposition, is uniformly, stoichiometrically correct and because the deposition methods of the present invention do not involve violent chemical or physical reactions which either significantly destabilize the silicon compound of its predetermined molecular formulation or cause non-uniform deposition of the compound, cracking, etc.

Another aspect of the invention involves the technique of solvent exchange. Generally, solvent exchange comprises adding the second solvent different from the solvent(s) of the original precursor and distilling away the other solvent(s). To remove the undesired solvents from a solution, the solution is heated above the boiling point of the solvents to be removed and below the boiling point of the solvent or solvents that are desired to be retained. For example, if a xylene solvent is desired, xylene is added to a given solution, and the other solvents are distilled away until the desired volume and viscosity are reached.

Furthermore, the present invention tailors a common solvent for the correct vapor pressure for flowing the precursor through the valves and system tubing, etc., while reducing clogging of the system from precursor residue.

Just before coating, an initiator may be added to the precursor. An initiator is a high vapor pressure, low boiling point, solvent that assists in initiating the formation of the mist. Preferably, the silicon moieties in the precursor are also soluble in the initiator, that is, the initiator is a solvent for the silicon moieties. A liquid with a boiling point of between about 50° C. and 100° C. is preferred as an initiator. Examples of liquids that may be used as initiators are given in Table B.

TABLE B

| Initiator | Boiling Point |
| --- | --- |
| Methyl Ethyl ketone (2-butanone) | 80° C. |
| Isopropanol | 82° C. |
| Methanol | 64.7° C. |
| Tetrahydrofuran | 67° C. |

According to the method of the present invention, the mist of a precursor liquid is evenly flowed across and onto a substrate at substantially ambient temperature. In this disclosure the term "ambient" means at the temperature of the surroundings, which preferably is room temperature, which is generally between 15° C. and 40° C. However, because various processes may be occurring during the deposition, such as drawing a vacuum, electrical poling, and/or the application of ultraviolet radiation, the actual temperature within deposition chamber 2 may vary from the temperature of the room in which the deposition takes place. Thus the use of the words "substantially ambient temperature". Substantially ambient temperature means generally within the range of −50° C. and 100° C. As will be discussed further below, a key aspect of the flow process is that the mist is flowed across the substrate via multiple input ports and exits the area above the substrate via multiple exhaust ports, with the ports being distributed in close proximity to and about the periphery of the substrate to create a substantially evenly distributed flow of mist across the substrate.

Another feature of the deposition process is that it is a relatively low energy process. It is believed that the deposition is caused by relatively low energy kinetic interactions between the liquid particles and also relatively low energy kinetic interactions between the particles and the barrier plate opposite the substrate. It has been found that heating the deposition chamber or substrate during deposition leads to inferior quality thin films. During, after, or both during and after deposition, the precursor liquid is treated to form a thin film of solid silicon dioxide or silicon glass on the substrate. In this context, "treated" means any one or a combination of the following: exposed to vacuum, ultraviolet radiation, electrical poling, drying, heating, and annealing. In the preferred embodiment UV radiation and electrical poling are optionally applied to the precursor solution during deposition. The ultraviolet radiation is preferably also applied after deposition. After deposition, the -material deposited on the substrate, which is liquid in the preferred embodiment, is preferably exposed to vacuum for a period, then is heated, and then annealed. The chemistry of this process is not entirely understood. It is believed that the UV assists in disassociating the silicon-dioxide molecules, or other elements that comprise the desired final silicon compound, from the solvent and the organics or other fragments of the precursor compounds. It is believed the electrical poling increases the dwell time of the mist in the area of the substrate thus increasing the chance of collisions with other mist particles which cause the particles to rebound toward the substrate. It is believed that exposure to vacuum helps to evaporate the solvent and remove the organics or other fragments that have become disassociated from the elements of the final silicon compound. It is believed that the heating removes whatever is left of the solvent, further disassociates the silicon-oxide molecules or other elements of the desired compound from the organics or other fragments of the precursor compounds, and drives off the organics. It is believed that after the heating step, the material of the deposited thin film essentially comprises a silicon dioxide compound, though it may not be in the final crystal structure. It is believed that the annealing may break up whatever bonds of the precursor chemical compounds that remain and drive off any remaining organics from the precursor compounds, but primarily repairs damaged areas and causes the silicon dioxide or silicon glass to form the final desired crystal structure. However, intermediate chemical compounds, that is compounds that are not either the original precursor chemical compounds nor the final desired silicon compound, may form during the deposition process, the vacuum exposure, the heating, and/or the annealing. The preferred process of the invention is one in which the misted precursor solution is deposited directly on the substrate and the dissociations and removal of the solvent and organics or other fragments takes place primarily after the solution is on the substrate. However, in another aspect the invention also contemplates a process in which the final desired chemical compound or an intermediate compound is separated from the solvent and organics during the deposition and the final desired chemical compound or an intermediate compound is deposited on the substrate. In both aspects, preferably, one or more bonds of the precursor pass through to the final film.

An important parameter of silicon dioxide or silicon glass thin films, such as ferroelectric films, is that they are generally required to be quite thin (for example, within a range of 200 angstroms–15000 angstroms). Such film thicknesses can be readily achieved by the process and apparatus according to the invention. The invention can also be used to generate much thicker films, if desired.

2. Deposition Apparatus

As shown in FIG. 1, there is a thin film deposition apparatus according to one exemplary embodiment of the invention, the apparatus being generally designated at 1. Apparatus 1 comprises a deposition chamber 2 containing a substrate holder 4, a barrier plate 6, an input nozzle assembly 8, an exhaust nozzle assembly 10, and an ultraviolet radiation source 16. The deposition chamber 2 includes a main body 12, a lid 14 which is securable over the main body 12 to define an enclosed space within the deposition chamber 2. The chamber is connected to a plurality of external vacuum sources described below. Lid 14 is pivotally connected to the main body 12 using a hinge as indicated at 15. In operation, a mist and inert carrier gas are fed in through tube 45, in direction 43, and pass through input nozzle assembly 8, where the mist is deposited onto substrate 5. Excess mist and carrier gas are drawn out of deposition chamber 2 via exhaust nozzle 10.

Substrate holder 4 is made from two circular plates 3, 3' of electrically conductive material, such as stainless steel, the top plate 3 being insulated from the bottom plate (field plate) 3' by an electrically insulative material, such as delrin. In an exemplary embodiment, utilizing a 4 inch diameter substrate, substrate holder 4 is nominally 6 inches in diameter and supported on a rotatable shaft 20 which is in turn connected to a motor 18 so that holder 4 and substrate 5 may be rotated during a deposition process. An insulating shaft 22 electrically insulates the substrate holder 4 and substrate 5 supported thereon from the DC voltage applied to the deposition chamber main body 12 so that a DC bias can be created between the substrate holder 4 and barrier plate 6 (via chamber main body 12). Such a DC bias may be utilized, for example, for field-poling of thin films as they are being deposited on the substrate 5. Insulating shaft 22 is connected to shaft 20 and shaft 20' by couplings 21. Electrical source 102 is operatively connected to main body 12 of deposition chamber 2 at connection 108 by lead 106 and via feedthrough 23 to brass sleeve 25 by lead 104 to effect a DC bias between field plate 3, and barrier plate 6.

Barrier plate 6 is made of an electrically conductive material such as stainless steel, and is of sufficiently large size to extend substantially over the substrate 5 in parallel thereto so that a vaporized source or mist as injected through input tube 26 and nozzle assembly 8 is forced to flow between barrier plate 6 and the substrate holder 4 over the substrate 5. Barrier plate 6 is preferably the same diameter as the substrate holder 4. As depicted in FIGS. 1, 11 and 12, the barrier plate 6 is preferably connected to the lid 14 by a plurality of rods 24 so that the plate 6 will be moved away from the substrate 5 whenever the lid is opened. The barrier plate 6 also includes a UV transmitting window 27 which is about 0.75 inches wide by four inches long. The window 27 permits the UV radiation from source 16 to directly fall on substrate 5. The window 27 is preferably made of quartz, but also may be made of suprasil or other suitable material.

FIGS. 11 and 12 show barrier plate 6 located at various distances from substrate holder 4. Each of the rods 24 is typically a stainless steel rod attached to deposition chamber lid 14. Each rod 24 is bored to accommodate a bolt 35 (FIG. 1) by which the rod 24 is attached to barrier plate 6. Each rod 24 is tapped to accommodate a set screw 36 which secures bolt 35 to the rod 24. By loosening set screw 36, re-positioning rod 24 relative to bolt 35, and then re-tightening set screw 36, the effective length of each rod is adjustable up to ½ inch without having to remove the rod 24 from the chamber lid 14. Each of the rods 24 is removable to allow sets of rods 24 of different lengths L, L', etc. to be substituted in order to coarsely adjust the corresponding spacing S, S', etc. between barrier plate 6 and substrate holder 4 (and substrate 5) depending on the source materials, flow rate, etc. For example, the rod length L may be adjusted to provide a spacing S in the range of 0.10–2.00 inches. Once in place, rods 24 are also adjustable as indicated above. Thus, rods 24, bolts 35, and set screws 36 comprise an adjusting means for adjusting the barrier plate 6. The spacing between substrate holder 4 and barrier plate 6 is preferably approximately between 0.375 inches and 0.4 inches when a precursor liquid for silicon dioxide, as prepared below, is to be deposited.

Figure 7:
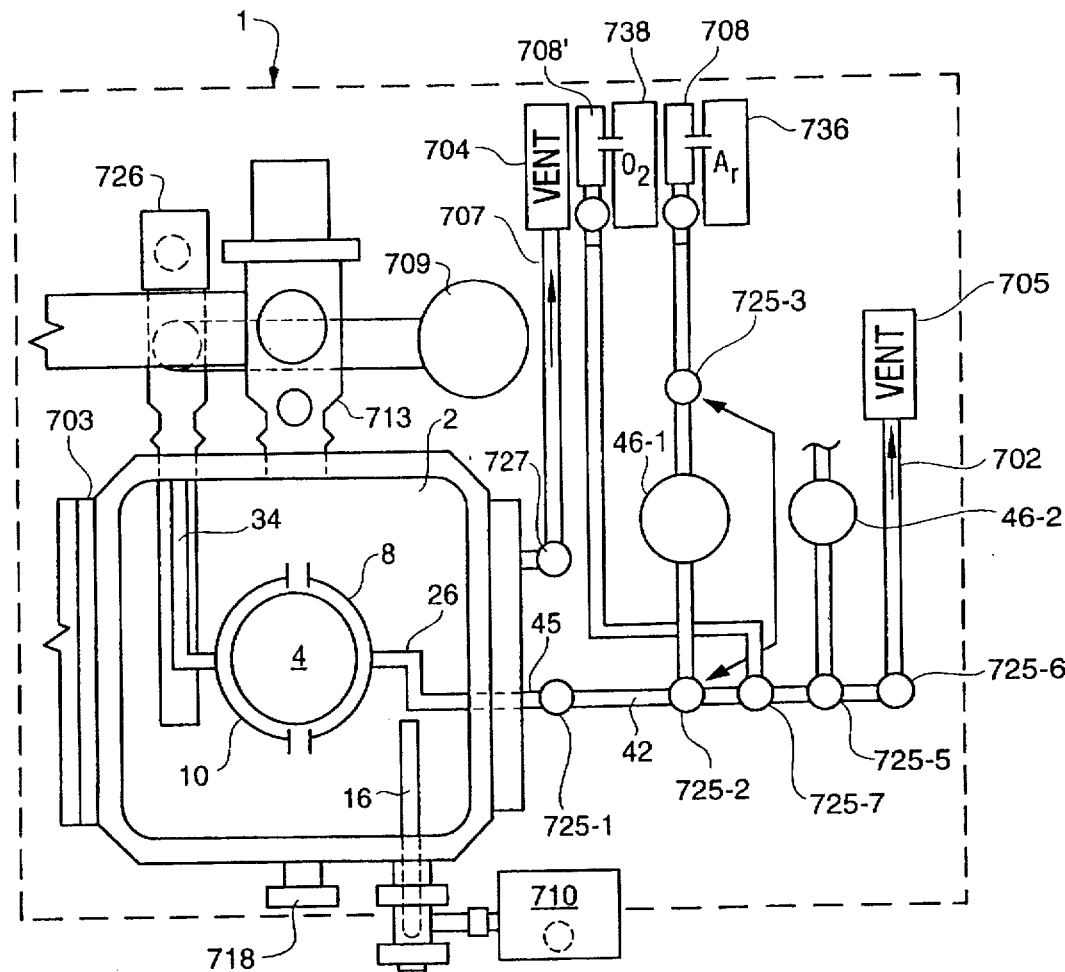
FIG. 7 is a top view of the apparatus of an exemplary embodiment of the invention.
Figure 9:
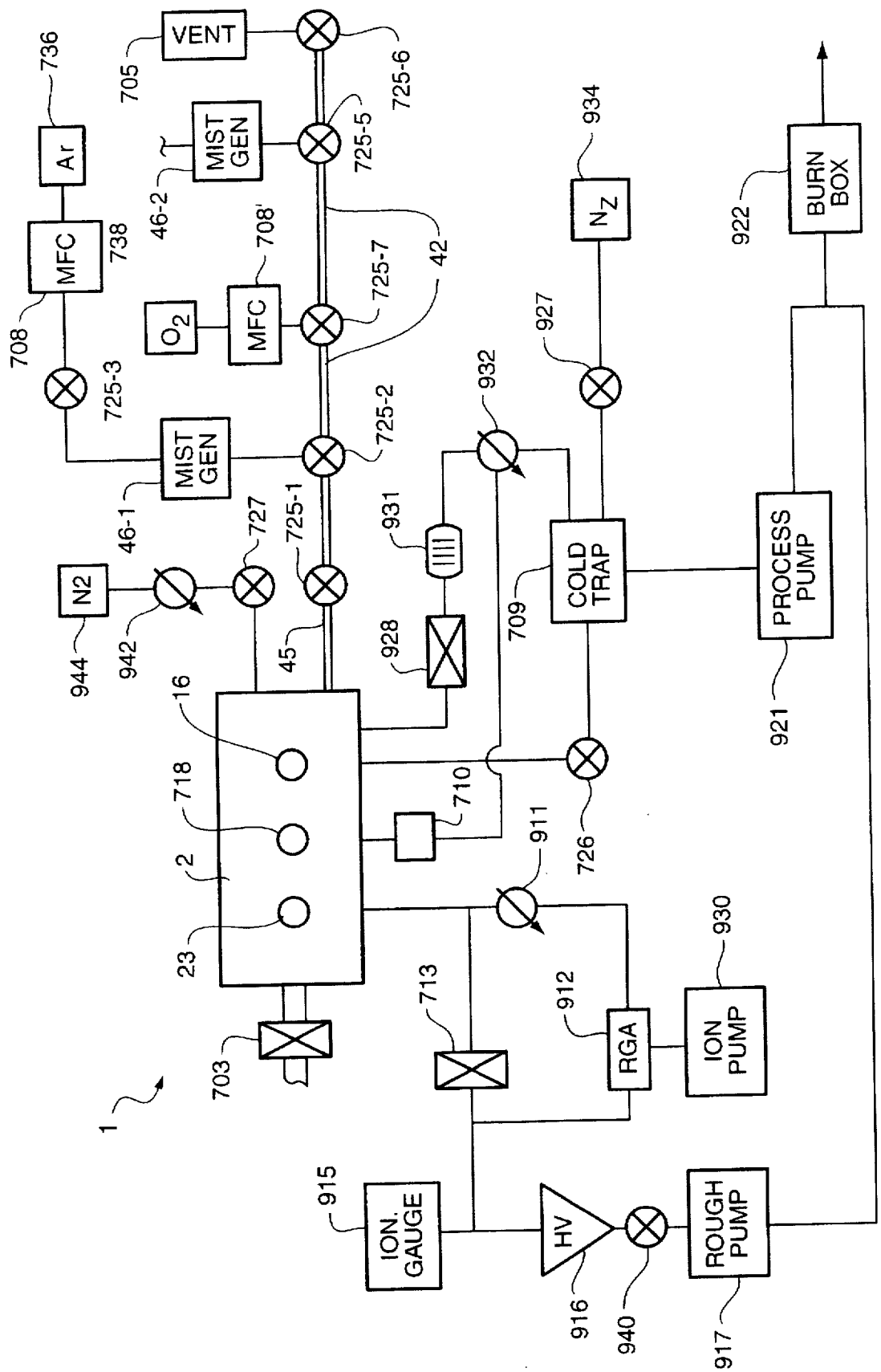
FIG. 9 is a schematic view of the apparatus corresponding to the embodiment of FIG. 7.

FIG. 7 is a top view of the apparatus of an exemplary embodiment of the invention, and FIG. 9 is a schematic view of the apparatus corresponding to the embodiment of FIG. 7. As shown in FIG. 7, a 0–1000 Torr temperature compensated capacitance manometer 710 monitors the pressure in deposition chamber 2, and its signal controls a downstream control valve 932 (FIG. 9) to maintain precise pressures in deposition chamber 2. As shown in FIG. 9, deposition chamber 2 is rough-pumped by vacuum pump 921, which in one embodiment is an Alcatel 2-stage, 11 CFM mechanical fore pump. After being rough-pumped, deposition chamber 2 is high vacuum pumped through a vacuum pump 916 such as a C.T.I. Cryo-Torr 100 high vacuum pump. Other turbomolecular or cryogenic pumps could also be used for high vacuum pumping. High vacuum pump-down of deposition chamber 2 to below $5.0 \times 10^6$ Torr is accomplished with valve 713 opened, using high vacuum pump 916, with valve 940 closed. High vacuum pump 916 is backed by pump 917 which is used as needed (typically every two weeks) for regeneration of pump 916, with valve 940 opened for this operation only. Ionization gauge 915 is used to monitor the vacuum in deposition chamber 2. High vacuum pump-down of deposition chamber 2 is used to facilitate adsorption of moisture from the chamber walls as well as from a substrate 5 located inside of the chamber, prior to a deposition operation.

As shown in FIG. 9, an RGA (residual gas analyzer) 912 may be provided for analyzing the decomposition products within deposition chamber 2 from one atmosphere to extremely low pressures. Mass resolution of up to 300 AMU is provided. In an exemplary embodiment, RGA 712 is a U.T.I. residual gas analyzer, connected to a Varian Associates 10 LPS ion pump 930.

Valves 727 and 942 are used to vent nitrogen from source 944 into the deposition chamber 2 for the purpose of back filling the chamber 2. Valve 942 is a needle valve which is used to precisely regulate the flow of nitrogen into the chamber 2.

Deposition chamber 2 is vacuum pumped to a pressure of between approximately 200 and 600 Torr during a deposition operation by means of process pump 921. The deposition chamber exhaust system includes, in addition to pump 921, a liquid nitrogen cold trap 709, and an MKS control valve 932 with controller and manual valve. Cold trap 709 may be purged with dry nitrogen from source 934. A Dayton solenoid valve 927 is used to back fill the roughing line with the dry nitrogen gas. Cold trap 709 is connected to process chamber 2 via valve 726, and also via needle valve 932, filter 931 and process line valve 928. The deposition chamber effluents are directed to a burn box and scrubber combination 922 to assure safe disposal of any toxic corrosive and flammable vapors.

Access to an external chamber (not shown) from deposition chamber 2 is provided through an air-operated slit valve 703. The interior of deposition chamber 2 can be viewed during a deposition operation through view port 718.

The precursor liquid is provided via a system that includes mass flow controller 708 and VCR valve 725-3 which control the dispersion rates of source materials through manifold assembly 40 (FIG. 3) into deposition chamber 2 by regulating the flow of an inert gas such as argon from source 736 into mist generator 46-1. Additional gas source, mass flow controller, and valve inputs (not shown) can be connected to mist generator 46-2, which connects to manifold assembly 40 via VCR valve 725-5. A separate mass flow controller 708' is used to introduce oxygen from source 738 and/or other inert or process-active gases into manifold assembly 40 via VCR valve 725-7.

Figure 2:
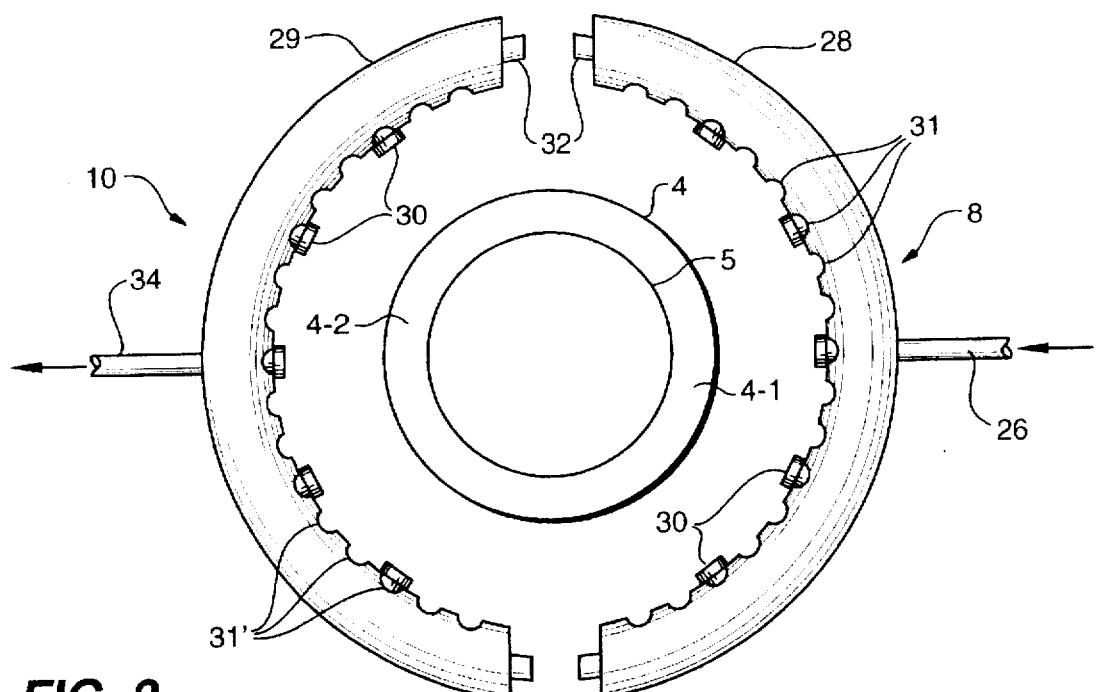
FIG. 2 is an enlarged plan view of an intake and exhaust nozzle assembly.

The input nozzle assembly 8 and the exhaust nozzle assembly 10 are more particularly shown with reference to FIG. 2. Input nozzle assembly 8 includes an input tube 26 which receives a misted solution from manifold assembly 40 as discussed below in relation to FIG. 3. Input tube 26 is connected to arcuate tube 28 which has a plurality of small holes or input ports 31 for accepting removable screws 30 spaced ¼ inch center-to-center along the inner circumference of the tube 28.

Exhaust nozzle assembly 10 comprises an arcuate exhaust tube 29 having a plurality of small holes or exhaust ports 31' with removable screws 30. The structure of the exhaust nozzle assembly 10 is substantially the same as that of the input nozzle assembly 8, except that a tube 34 leads to a vacuum/exhaust source (not shown). End caps 32 of tubes 28 and 29 are removable for cleaning. Arcuate tube 28 of input nozzle assembly 8 and the corresponding arcuate tube 29 of exhaust nozzle assembly 10 respectively surround oppositely disposed peripheral portions 4-1, 4-2 of substrate holder 4.

In an exemplary embodiment wherein a silicon dioxide film is to be deposited, the centers of holes 31, 31' in tubes 28 and 29 are nominally located 0.375 inches above substrate holder 4. However, referring to FIG. 1, this distance is adjustable using different lengths of shaft 20' to suit the specific deposition process.

Each of the tubes 28, 29, is typically fabricated from ¼" O.D. stainless steel, with an inner diameter of approximately $3/16$". The interior walls of each tube 28,29 are preferably electro-polished. Holes 31, 31' in tubes 28 and 29 respectively are spaced approximately ¼" center-to-center, and are tapped to accommodate 4–40 ($1/8$") socket head set screws.

Through such structure, and by adjusting the location of open holes 31, 31' by selectively inserting or removing screws 30 in the two arcuate tubes 28 and 29, the flow of a vaporized solution or mist over the substrate 5 can be well controlled for various solutions and flow rates, etc., to achieve a uniform deposition of a thin film on substrate 5.

Referring to FIGS. 1 and 2, substrate holder 4, barrier plate 6, input nozzle assembly 8 and exhaust nozzle assembly 10 collectively cooperate to define a relatively small, semi-enclosed deposition area 17 surrounding an upper/ exposed surface of the substrate 5, and within which the vaporized solution is substantially contained throughout the deposition process.

Although exemplary embodiments of substrate holder 4, barrier plate 6, input nozzle assembly 8 and exhaust nozzle assembly 10 are shown and described, it is understood that variations of such structures can be utilized within the scope of the present invention. For example, the arcuate input and exhaust tubes 28 and 29 could be replaced with tubes of other structures such as V-shaped or U-shaped tubes, or slotted tubes, or could simply be replaced by a plurality of separate nozzles and separate exhaust ports.

Figure 3:
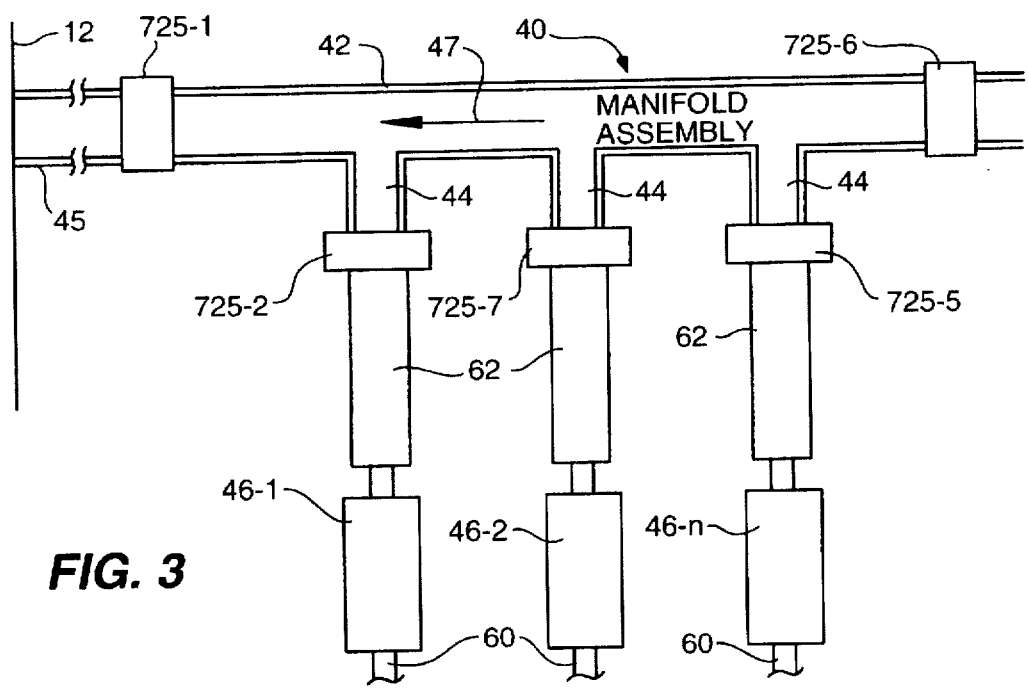
FIG. 3 is an enlarged schematic top view of a manifold system used in the invention.

FIG. 3 shows a manifold assembly 40 according to the present invention. The manifold assembly 40 is utilized for supplying a vaporized solution (mist or aerosol) to input nozzle assembly 8, and generally comprises a mixing chamber 42, a plurality of inlets 44 which are connected to corresponding mist generators through respective valves 725-2, 725-5, 725-7, a deposit valve 725-1 for regulating flow from the mixing chamber 42 to the nozzle assembly 8, and an exhaust vent valve 725-6.

In use, one or more of the mist generators -1,46-2, and 46-N- are utilized to generate one or more different mists which are then flowed into the mixing chamber 42 through valves -1,725-2, 725-5, 725-6, and inlets 44.

The mists as flowed into the mixing chamber 42 are mixed to form a single, uniform misted solution which is then flowed into the deposition chamber 2 at an appropriate flow rate through the valve 725-1 and input tube 26. Valve 725-1 can be selectively closed off so that the deposition chamber 2 can be pumped down if desired, or to clean and purge the manifold system when necessary. Similarly, the outlet of the exhaust valve 725-6 is connected to a vacuum source (not shown) so that, when necessary to exhaust/purge one or more of the mist generators 46, valve 725-1 can be closed off, valve 725-6 and one or more of the valves 725-* can be opened, and the mixing chamber 42 can be pumped down to clean and purge the mist generator(s) 46 and the mixing chamber 42 by applying a vacuum via pump 921 and/or pump 916, or using standard negative draw type exhaust.

An important aspect of the invention is that stabilized precursor solutions are agitated ultrasonically to atomize or nebulize the solutions before they are introduced into the deposition chamber 2. This atomization produces a mist of the stabilized precursor solution(s) which provides an important basis for the improved operation of the present invention.

Figure 4:
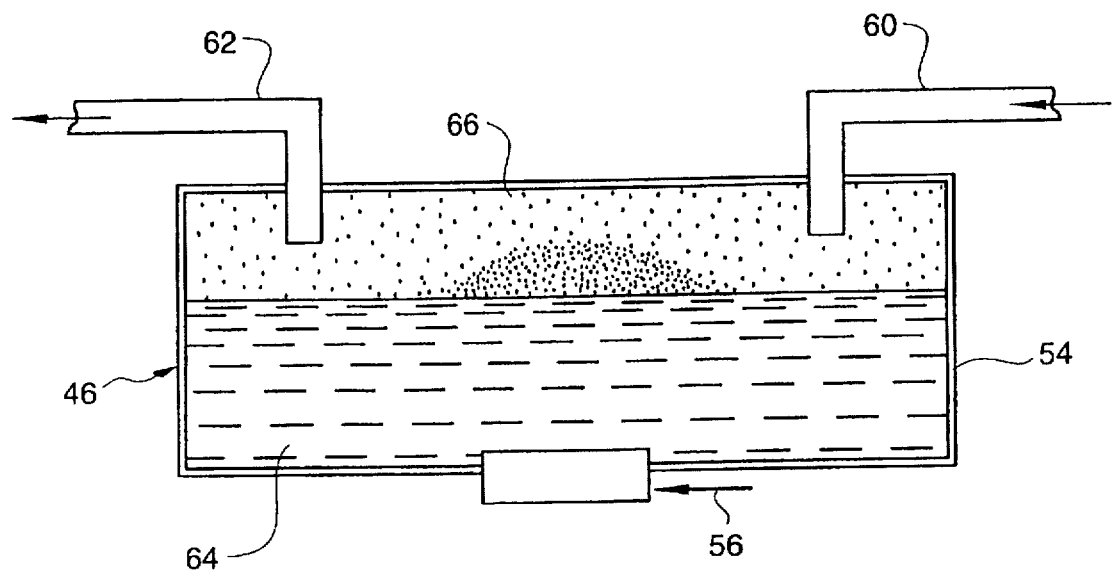
FIG. 4 is a schematic side view of a mist generating apparatus used in the present invention.
Figure 5:
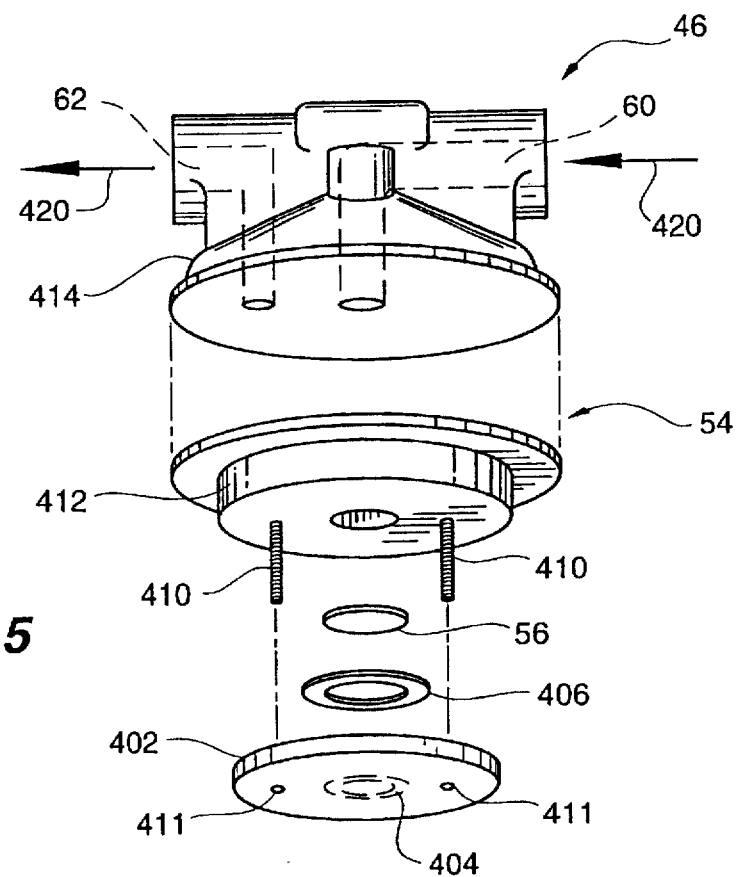
FIG. 5 is an exploded view of the mist generating apparatus of FIG. 4.

FIG. 4 illustrates a schematic side view of an exemplary embodiment of the mist generating apparatus used in the present invention. FIG. 5 is an exploded view of the mist generating apparatus of FIG. 4. As shown in FIGS. 4 and 5, mist generator 46 includes a closed container 54, a TDK TU-26B or equivalent ultrasonic transducer 56 fluid-tightly and vacuum sealed into the bottom of the container 54. Container 54 is a modified Millipore Waferguard T-Line gas filter unit (catalog no. YY50 005 00) without the internal filter cartridge. The direction of gas flow as indicated by arrows 420 is opposite to that which would be used in normal operation of the filter. Transducer 56 is mounted in a recessed hole in bottom section 412 of mist generator 46 and is affixed to section 412 by two 8–32 threaded studs 410 which pass through holes 411 in a delrin mounting block 402. A teflon "O" ring 404 and teflon seal 406 provide a pressure- and vacuum-tight seal between the transducer 56 and the inside of container 54. Mist generator 46 also includes an inlet port 60 and an outlet port 62 for passing a carrier gas through the container 54.

Before operation, a predetermined amount of precursor liquid 64 is introduced into container 54 after separating bottom section 412 from top section 414 of container 54. During operation, transducer 56 is electrically activated to generate a mist 66 of the precursor liquid, and an inert carrier gas is passed into the mist 66 via port 60 where it becomes wet or saturated with the mist, and the wet carrier gas is then passed from the outlet port 62 into the manifold assembly 40. The carrier gas is normally an inert gas such as argon, helium, or nitrogen, but may comprise a reactive gas in appropriate situations.

The mist generator 46 shown in FIGS. 4 and 5 is particularly advantageous because it creates a vaporized solution which can be effectively flowed or injected into the deposition chamber 2 without complications such as freezing.

Although the mist generator 46 shown in FIGS. 4 and 5 is preferred according to the invention, it will be understood that other mist generators could be utilized according to the invention. For example, a spray nozzle could be used to generate a mist of a precursor liquid within a closed container, and an appropriate carrier gas could be flowed through the mist and into the mixing chamber 40 using an inlet and outlet port similar to the ports 60, 62 shown in FIGS. 4 and 5.

FIG. 10 is a perspective view showing the placement of an ultraviolet radiation source 16 within the deposition chamber 2. Photo-enhancement of the present process is effected by providing UV (ultraviolet) light during and after the deposition process which is believed to stimulate the disassociation of solvent and organics from the precursor, thereby accelerating the drying process. In addition, the use of UV radiation prior to the deposition process facilitates the removal (desorption) of moisture from deposition chamber 2 as well as from substrate 5. The location of ultraviolet light source 16 within the deposition chamber is not critical because of the fact that the ultraviolet radiation is reflected off of the stainless steel walls of deposition chamber 2 into the space between the input nozzle 8 and exhaust nozzle 10, as well as onto substrate 5, where the radiation can provide the above-described photo-enhancement effect.

UV source 16 includes at least one UV lamp located in deposition chamber 2, for applying an ultraviolet radiation bath therein. Spectral sources which could be used include ultraviolet lamps and excimer lasers. In either case, the radiation bath applied by UV source 16 is tuned to optimize the dissociation of the desired chemical compound from the solvent and the organics or other fragments. In the first case, radiation emitted by an excimer laser is spectrally "tuned" to correspond to the energy needed to dissociate or crack the solvent bonds, the precursor chemical compound bonds and/or any intermediate organic complex bonds formed during the deposition process holding the desired compound in a given precursor liquid. Alternatively, if UV source 16 is a UV lamp (or plurality of lamps), then "tuning" is accomplished by exchanging one (or a set of) the UV lamps with another one of (or set of) UV lamps which have a more desirable frequency spectrum. The UV source should also be of relatively low power, since otherwise it could dry out the precursor mist.

For deposition of the silicon precursors discussed herein, a Danielson Phototron PSM-275 UV radiation source 16 which emits UV radiation rays having a wavelength of approximately 180–260 nanometers. UV radiation in this wavelength range is particularly effective in resonating and dissociating the hydroxyl bonds holding the silicon in the vaporized sol-gel, MOD, or other liquid chemical source.

Apparatus 1 shown in FIGS. 1, 7, and 9 includes electrical means 102 for applying a DC bias in the deposition chamber 2 during a deposition operation. FIG. 1 shows the DC input 104. The DC potential applied between input sleeve 25 and deposition chamber main body 12 is typically 350 volts. The DC bias achieves poling in-situ of the ferroelectric film adding to the film quality.

A DC bias of either greater than or less than 350 volts could also be used to effectuate the above results. In addition, while deposition is occurring, combinations of ultraviolet radiation and DC bias may be applied within chamber 2 either together or sequentially, and repeated.

Figure 6:
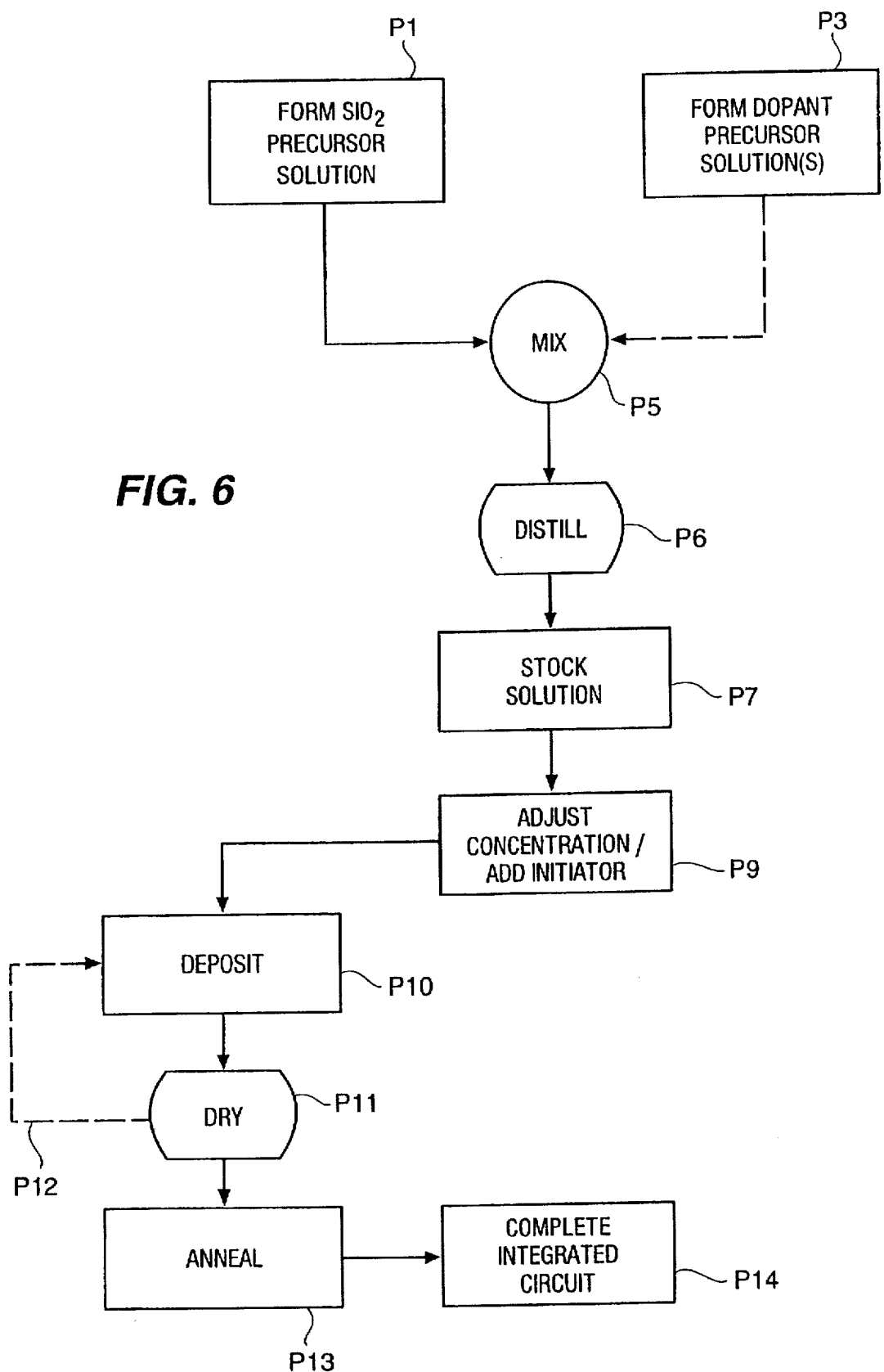
FIG. 6 is a flow chart showing the preparation of a silicon dioxide or silicon glass precursor according to the present invention.

A supplemental heating means, such as a hot plate, (not shown) may be used to bake and/or anneal a film of a precursor liquid which has previously been deposited on a substrate, the baking and annealing being preferably conducted in an auxiliary chamber, although the baking/annealing process could be performed within the deposition chamber 12, as discussed in relation to steps $P_{11}$ and $P_{12}$ of FIG. 6. The annealing is preferably performed in an oxygen furnace. High energy density ultraviolet radiation, such as from a diffused excimer laser source is also a preferred method of annealing.

3. Example of the Process

Referring to FIG. 6, there is shown an exemplary flow chart depicting the method of the invention in which silicon dioxide or silicon glass is deposited utilizing the apparatus of FIGS. 1–5. In this example, the layer deposited was silicon dioxide. In step P1, the silicon dioxide precursor was prepared. First, the quantities of materials indicated in Table I were measured. In Table I, "FW" indicates formula weight, "grams" the weight in grams, "mmoles" indicates millimoles, and "Equiv." indicates the equivalent

TABLE I

| Compound | FW | grams | mmole | Equiv. |
|---|---|---|---|---|
| Silicon Butoxide | 320.54 | 1.3018 | 4.0613 | 1.0000 |
| neodecanoic acid | 172.27 | 2.9905 | 17.359 | 4.2742 | number of moles in solution. The vendor of the silicon butoxide was Strem, while the neodecanoic acid was obtained from Morton-Thiokol. Continuing with step P1, the silicon butoxide and the neodecanoic acid were placed in a flask with 50 milliliters (ml) of xylenes. The mixture was heated for eighteen hours to a maximum temperature of 115° C. and stirred to distill out all water. Then 35 ml of xylenes was added and the heat was raised to a maximum of 135° C. to allow all butanol and water to distill from solution. The distilling step may be part of the forming step, P1, as it is in the preferred embodiment described above, but is shown separately as step P5, since it is an essential step. That is, distilling out as much water as possible to make an essentially anhydrous final precursor is important to prevent deterioration of the precursor when storing. Also, optionally, dopants and other additives may be added in step P3 and mixed with the precursor. This generally is the case when a silicon glass, such as borophosphosilicate glass (BPSG) is to be deposited. In step P7, the mixture was diluted out with additional xylenes until the solution weighed 40.617 grams. This provided a stock solution with a concentration of 0.0999 mmole Si/gram. The precursor may be stored at this point. Just prior to deposition, in step P9, 20.306 grams of the solution was weighed and diluted with xylenes to 40.609 grams. This provided a solution of concentration of 0.05000 mmole of silicon per gram. Returning to step P9, about 9.0 milliliters of a silicon dioxide precursor as described above was placed in container 54 of mist generator 46 along with about 5.0 ml of methyl ethyl ketone (MEK) initiator. Initially, a substrate 5 comprising a silicon wafer 1222 (FIGS. 13 and 14) deposited on it was pre-baked on a hot plate at atmospheric pressure (@ Colorado Springs, Colo.) at 400° C. for 10 minutes. The substrate was placed in the deposition chamber on the substrate holder. The deposition chamber was pumped down to 10 Torr using rough pump 921 via valve 726 and high vacuum pump 916 via valve 713. A 350 volt DC bias was applied between sleeve 25 and the main body 12 of the deposition chamber. Next, substrate rotation motor 18 was turned on to rotate substrate holder 4 at about 5 rotations per minute. UV source 16 was then turned on for 30 minutes to desorb the moisture in the deposition chamber as well as any moisture on the substrate. High vacuum valve 713 was then closed off, and the deposition chamber was slowly back filled via valves 727 and 942 with an inert gas source 944 such as argon or nitrogen to a pressure of approximately 595 Torr. Next, the process vacuum line was opened by opening exhaust throttle valve 928, filter 931, and needle valve 932 to stabilize the deposition chamber pressure at approximately 595 Torr. Injection valve 725-1 and deposit valve 725-2 were then opened and valve 725-6 was closed to start the flow of argon from source 736 through ultrasonic mist generator 46 which was then turned on for 30 minutes to cause a film of approximately 1500 Angstroms to be deposited at substantially ambient temperature on the substrate. The deposition process used argon carrier gas to flow the silicon dioxide precursor mist over the substrate. After a sufficient film of the silicon dioxide precursor was deposited on the substrate to produce a thin film, the mist generator, UV source, and substrate rotation motor were turned off. Deposit valve 725-1 was then closed, valve 725-6 was then opened and transducer 56 was turned off, to vent manifold 42 through vent 705 until mist generator 46-1 reached ambient temperature. Manifold 42 was purged through vent 705 by applying argon gas from source 736 to complete step P10.

In step P11, while the wafer remained in the deposition chamber, the chamber was slowly pumped down to 0.4 Torr for ½ hour using pump 921. During the slow-pumping, valve 928, filter 931, and valve 932 remained open until the chamber pressure reached 0.4 Torr. Thereafter, valve 928 was closed and valve 713 was opened to allow high-vacuum pump 916 to pump the deposition chamber 2 down to $10^{-6}$ torr for 10 minutes to dry the silicon precursor and form a solid silicon compound on the substrate. Then another two layers of silicon dioxide were deposited as described above. Next, valve 713 was closed and the deposition chamber was vented to atmospheric pressure by opening vent valve 727. The wafer was then removed from the deposition chamber and post-baked at 400° C. for two minutes, to complete step P11. In step P13, the wafer was then annealed in an oxygen atmosphere at 750° C. for 60 minutes. In step P14, a platinum bottom electrode, a BST layer 1230, and a top platinum electrode 1232 was deposited then the wafer was etched using well-known photo-resist techniques to produce a plurality of electronic devices, as is further described below.

As indicated above the devices had good conformal coverage with little variation in thickness across the wafer, good step coverage, no cracking. The BST capacitor formed was of integrated circuit quality.

Figure 8:
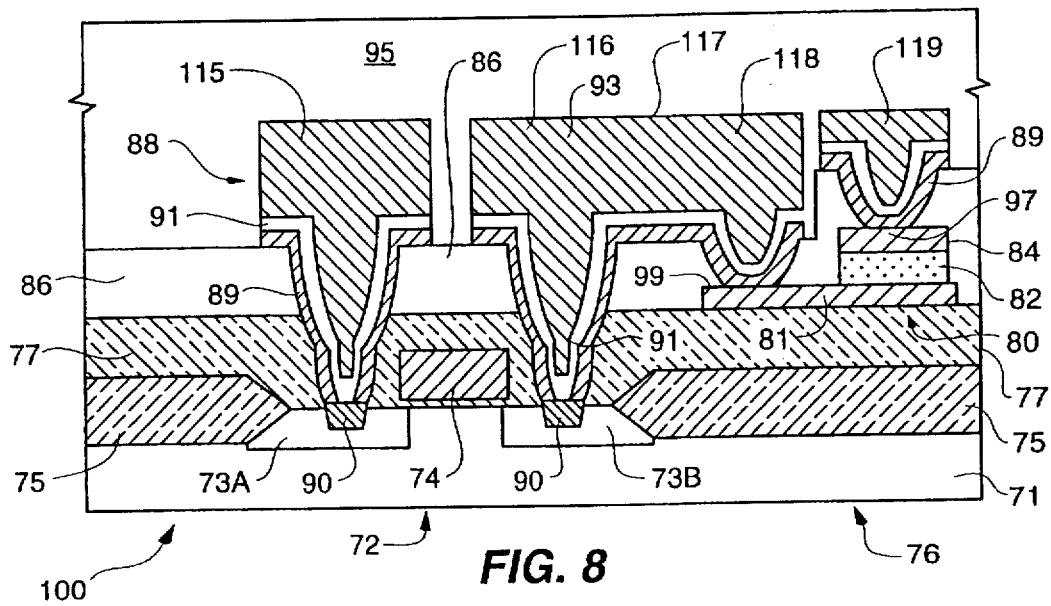
FIG. 8 is a cross-sectional view of an integrated circuit as may be made using the method and apparatus of the invention.
Figure 13:
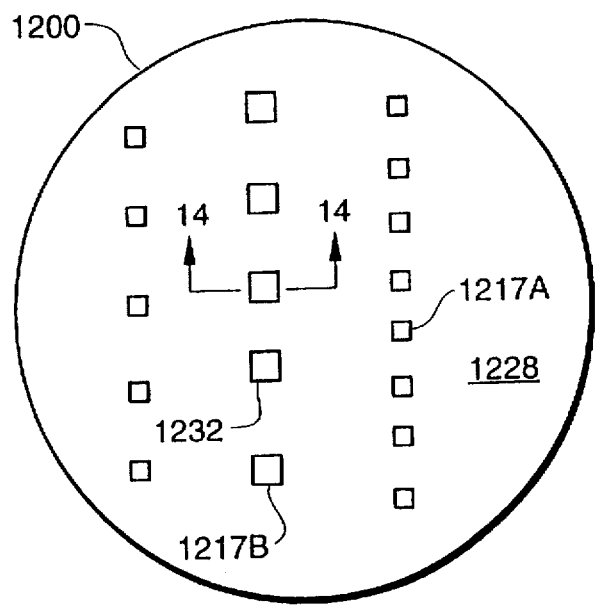
FIG. 13 is a top view of a wafer fabricated with the apparatus and methods of the invention.
Figure 14:
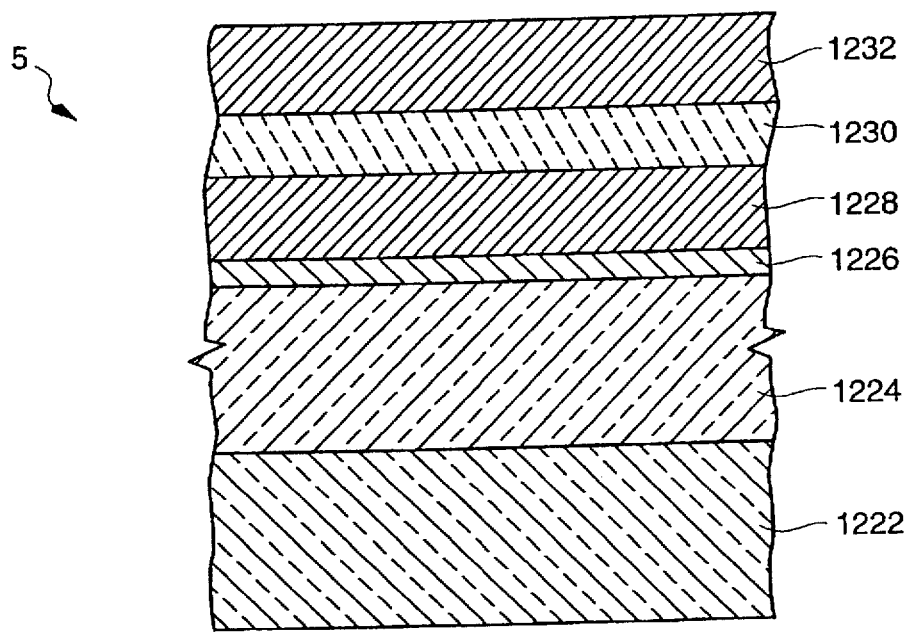
FIG. 14 is a cross-sectional view of the wafer of FIG. 13 taken through the line 14—14 of FIG. 13.

Turning now to FIG. 8, a cross-sectional view of a portion of an integrated circuit 100, portions of which are made by the method of the invention, is shown. It should be understood that FIGS. 8, 13, and 14 depicting an integrated circuit are not meant to be actual cross-sectional views of any particular portion of an actual semiconducting device, but are merely idealized representations which are employed to more clearly and fully depict the structure and process of the invention than would otherwise be possible. The portion of the integrated circuit 100 shown represents one memory cell 76 which includes a transistor 72 and a capacitor 80. Portions of the integrated circuit 100, particularly the layers 77, 86, and 95, may be formed utilizing the apparatus and process of the invention. Other layers, such as layer 82, may be formed using the apparatus of the invention with a metal-oxide precursor. When the layer 82 is a ferroelectric material such as strontium bismuth tantalate, the integrated circuit is a non-volatile ferroelectric (FERAM) switching memory cell, and when the layer 82 is a dielectric material such as BST, the integrated circuit 100 is a volatile DRAM memory cell.

Integrated circuit 100 includes a substrate 71, preferably a single crystal silicon wafer, on which transistor 72 is formed. Transistor 72 comprises source/drain active areas 73A and 73B, formed by doping areas of substrate 71, and gate 74. Integrated circuit 100 further includes field oxide areas 75, and first insulating layer 77 on which capacitor 80 is formed. First insulating layer 77 may include a gate oxide and thermal oxide though these are not shown separately, because, as is well-known, though they are formed in different steps they essentially merge because they are made of the same material. First insulating layer 77 conventionally may also include a non-doped silicon glass layer, a BPSG (borophosphosilicate glass) layer, and an SOG layer. However, according to the invention layer 77 comprises 5 to 10 layers of silicon dioxide and/or BPSG formed by the process of the invention. Capacitor 80 includes first electrode 81, intermediate layer 82, which may be a ferroelectric or a high-dielectric constant material, and second electrode 84. Second insulating layer 86 overlies the capacitor 80, and wiring layer 88, often referred to as a metallization layer, connects the active area 73B with first electrode 81 of capacitor 80, and active area 73A and second electrode 84 with other portions of the circuit. Wiring layer 88 is preferably a multilayered structure including a first layer 90 in contact with the active area 73A and 73B, a second layer 91, and a third layer 93 which contacts the surfaces 99 and 97 of capacitor electrodes 81 and 84 respectively. Layers 90, 91, and 93 include portions 115 and 116 overlaying active areas 73A and 73B respectively, portion 118 overlying surface 99 of first electrode 81, portion 119 overlying surface 97 of second electrode 84, and portion 117 connecting portions 116 and 118. Portions 115 and 116 penetrate second insulating layer 86 and first insulating layer 77 to contact active areas 73A and 73B respectively, portion 117 overlies second insulating layer 86, and portions 118 and 119 penetrate second insulating layer 86 to contact surface 99 of first electrode 81 and surface 97 of second electrode respectively. Portions 116 and 118 are electrically connected by portion 117 thereby electrically connecting active area 73B to surface 99 of first electrode 81. In other embodiments active area 73B may be connected to second electrode 84, since the capacitor 80 will operate with the electric field or voltages placed across it being in either direction. A capping layer 95, preferably phosphorous-doped silicon glass, completes the layered structure of the integrated circuit. As is well-known, such integrated circuits 100 are generally made on a wafer which is subsequently sawed in to hundreds of individual integrated circuit chips, each chip containing thousands or millions of cells 76. Each chip is then packaged to produce the finished integrated circuit.

Although there has been described what is at present considered to be the preferred embodiments of the present invention, it will be understood that the invention can be embodied in other specific forms without departing from the spirit or essential characteristics thereof. The present embodiments are, therefore, to be considered in all aspects as illustrative and not restrictive. The scope of the invention is indicated by the appended claims rather than the foregoing description.

We claim:

1. A method of fabricating a thin film of silicon dioxide or silicon glass, said method comprising the steps of:
   (a) providing a liquid precursor; containing a silicon compound selected from the group consisting of carboxysilanes, alkoxycarboxysilanes and water-free alkoxysilanes,
   (b) placing a substrate inside an enclosed deposition chamber;
   (c) producing a mist of said liquid precursor;
   (d) flowing said mist through said deposition chamber to form a layer of the precursor liquid on said substrate; and
   (e) treating the liquid layer deposited on said substrate to form a solid film of a silicon material selected from the group consisting of silicon dioxide and silicon glass.

2. A method as in claim 1 wherein said step of flowing is performed while maintaining said deposition chamber at ambient temperature.

3. A method as in claim I wherein said silicon material forms part of an integrated circuit, said method further including the step completing the fabrication of said integrated circuit to include at least a portion of the silicon material as an insulator for an electronic device in the integrated circuit.

4. The method of claim 1, wherein said liquid precursor comprises a metal alkoxide in a solvent.

5. The method of claim 1, wherein said liquid precursor comprises a metal carboxylate in a solvent.

6. The method of claim 1, wherein said step of flowing said mist into said deposition chamber is performed while maintaining a vacuum in the deposition chamber.

7. The method of claim 6, wherein said film is deposited while said deposition chamber is maintained at a vacuum of between approximately 200 Torr and 800 Torr.

8. The method of claim 1, wherein said step of flowing comprises injecting said mist into said deposition chamber in close proximity to and around the periphery of one side of said substrate and exhausting said mist from said deposition chamber at a region in close proximity to and around the periphery of an opposite side of said substrate to create a substantially evenly distributed flow of mist across the substrate.

9. The method of claim 1, wherein a surface of said substrate defines a substrate plane and said mist is flowed between said substrate and a barrier plate located within said deposition chamber in a spaced relation to said substrate and parallel to said substrate plane.

10. The method of claim 9, wherein said barrier plate is adjustable to vary the distance between the barrier plate and the substrate.

11. The method of claim 1, including the additional step of rotating said substrate in a plane parallel to a surface of said substrate while said mist is flowing over said substrate.

12. The method of claim 1, including the additional step of applying ultraviolet radiation to said mist while the mist is flowing through the deposition chamber.

13. The method of claim 1, including the step of applying a DC bias between said deposition chamber and said substrate.

14. The method of claim 1, wherein said step of producing a mist comprises ultrasonically vibrating a quantity of said liquid precursor to form said mist by nebulization.

15. The method of claim 1, wherein said step of treating includes one or more steps from the group of drying, baking and annealing said layer deposited on said substrate.

16. The method of claim 1 wherein said step of treating comprises drying said liquid precursor deposited on said substrate.

17. The method of claim 16 wherein said step of drying comprises maintaining a sub-atmospheric pressure in said deposition chamber.

18. The method of claim 1 wherein said liquid precursor includes a metal compound in a solvent, said solvent selected from the group consisting of xylenes, 2-methoxyethanol, n-octane, and n-butyl acetate.

* * * * *